(12) United States Patent
Kageshima et al.

(10) Patent No.: US 9,768,047 B2
(45) Date of Patent: Sep. 19, 2017

(54) SIC EPITAXIAL WAFER AND METHOD FOR PRODUCING SAME, AND DEVICE FOR PRODUCING SIC EPITAXIAL WAFER

(71) Applicant: SHOWA DENKO K.K., Tokyo (JP)

(72) Inventors: Yoshiaki Kageshima, Chichibu (JP); Daisuke Muto, Chichibu (JP); Kenji Momose, Chichibu (JP); Yoshihiko Miyasaka, Sanmu (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 15/260,152

(22) Filed: Sep. 8, 2016

(65) Prior Publication Data

US 2016/0379860 A1 Dec. 29, 2016

Related U.S. Application Data

(62) Division of application No. 14/233,289, filed as application No. PCT/JP2012/067841 on Jul. 12, 2012, now abandoned.

(30) Foreign Application Priority Data

Jul. 19, 2011 (JP) ................. 2011-157918

(51) Int. Cl.
*H01L 29/15* (2006.01)
*H01L 21/68* (2006.01)
(Continued)

(52) U.S. Cl.
CPC .......... *H01L 21/681* (2013.01); *C23C 16/325* (2013.01); *C23C 16/4401* (2013.01); *C23C 16/52* (2013.01); *C30B 25/02* (2013.01); *C30B 25/12* (2013.01); *C30B 25/16* (2013.01); *C30B 29/36* (2013.01); *H01L 21/0262* (2013.01); *H01L 21/02378* (2013.01);
(Continued)

(58) Field of Classification Search
CPC ... C30B 25/16; C30B 25/12; H01L 21/02378; H01L 29/1608
See application file for complete search history.

(56) References Cited

FOREIGN PATENT DOCUMENTS

| JP | 11-329976 A | 11/1999 |
|----|----|----|
| JP | 2004-507897 A | 3/2004 |

(Continued)

OTHER PUBLICATIONS

Communication dated Sep. 20, 2016 from the Japanese Patent Office in counterpart application No. 2016-008570.
(Continued)

*Primary Examiner* — David Vu
*Assistant Examiner* — Brandon Fox
(74) *Attorney, Agent, or Firm* — Sughrue Mion, PLLC

(57) ABSTRACT

A SiC epitaxial wafer manufacturing method of the present invention includes: manufacturing a SiC epitaxial wafer including a SiC epitaxial layer on a surface of a SiC single crystal wafer while supplying a raw material gas into a chamber using a SiC epitaxial wafer manufacturing apparatus; and manufacturing a subsequent SiC epitaxial wafer after measuring a surface density of triangular defects originating from a material piece of an internal member of the chamber on the SiC epitaxial layer of the previously manufactured SiC epitaxial wafer.

5 Claims, 8 Drawing Sheets

(51) Int. Cl.
    C30B 29/36    (2006.01)
    H01L 21/02    (2006.01)
    C30B 25/02    (2006.01)
    C30B 25/12    (2006.01)
    C30B 25/16    (2006.01)
    H01L 29/16    (2006.01)
    H01L 29/34    (2006.01)
    C23C 16/44    (2006.01)
    C23C 16/32    (2006.01)
    C23C 16/52    (2006.01)

(52) U.S. Cl.
    CPC .. *H01L 21/02433* (2013.01); *H01L 21/02529* (2013.01); *H01L 21/02576* (2013.01); *H01L 29/1608* (2013.01); *H01L 29/34* (2013.01)

(56) References Cited

FOREIGN PATENT DOCUMENTS

| JP | 2005-235845 | A |   | 9/2005 |
|----|-------------|---|---|--------|
| JP | 2008-311542 | A |   | 12/2008 |
| JP | 2008311542  | A | * | 12/2008 |
| JP | 2009-164162 | A |   | 7/2009 |
| JP | 2009-256138 | A |   | 11/2009 |
| JP | 4581081     | B2 |  | 9/2010 |
| JP | 4581081     | B2 |  | 11/2010 |
| JP | 2011-49496  | A |   | 3/2011 |
| JP | 2012-051795 | A |   | 3/2012 |
| WO | 2011/074453 | A1 |  | 6/2011 |

OTHER PUBLICATIONS

Bernd Thomas, et al., "Epitaxial Growth of n-Type 4H-SiC on 3" Wafers for Power Devices", Materials Science Forum, 2005, pp. 141-146, vols. 483-485.

Communication dated Sep. 28, 2015 from the State Intellectual Property Office of the P.R.C. in counterpart application No. 201280035315.9.

Extended European Search Report dated Feb. 17, 2015, issued by the European Patent Office in counterpart European application No. 12814185.0.

International Search Report for PCT/JP2012/067841 dated Oct. 2, 2012.

James D. Oliver, "A Designed Experiment Approach to Improvement and Understanding of the SiC Epitaxial Growth Process", Materials Science Forum, 2007, pp. 57-60, vol. 556-557.

R. A. Berechman, et al., "Electrical and structural investigation of triangular defect in 4H-SiC junction barrier Schottky devices", Journal of Applied Physics, 2009, pp. 074513-1-074513-7, vol. 105.

Communication (Restriction/Election of Species Requirement) dated Sep. 1, 2015 from the United States Patent and Trademark Office, of U.S. Appl. No. 14/233,289.

Communication (Non Final Office Action) dated Oct. 23, 2015 from the United States Patent and Trademark Office, of related U.S. Appl. No. 14/233,289.

Communication (Final Office Action) dated Jun. 8, 2016 from the United States Patent and Trademark Office, of related U.S. Appl. No. 14/233,289.

* cited by examiner

SIC EPITAXIAL WAFER AND METHOD FOR PRODUCING SAME, AND DEVICE FOR PRODUCING SIC EPITAXIAL WAFER

CROSS-REFERENCE TO RELATED APPLICATIONS

This is a Rule 53(b) Divisional application of U.S. application Ser. No. 14/233,289 filed Jan. 16, 2014, which is a National Stage of International Application No. PCT/JP2012/067841 filed Jul. 12, 2012, which claims benefit of Japanese Patent Application No. 2011-157918 filed Jul. 19, 2011, the contents of all of which are incorporated herein by reference in their entirety.

TECHNICAL FIELD

The present invention relates to a SiC epitaxial wafer, a SiC epitaxial wafer manufacturing method, and a SiC epitaxial wafer manufacturing apparatus.

BACKGROUND ART

Silicon carbide (SiC) has characteristics in which a breakdown electric field is larger by a single digit, a band gap is three times larger, and thermal conductivity is about three times larger than silicon (Si). Accordingly, silicon carbide (SiC) is expected to be applied to power devices, high-frequency devices, high-temperature operation devices, and the like. A SiC epitaxial wafer is manufactured by growing a SiC epitaxial layer serving as an active region of a SiC semiconductor device on a SiC single crystal wafer processed from bulk single crystal of SiC produced by a sublimation method or the like according to chemical vapor deposition (CVD). The foregoing SiC single crystal wafer is used as a substrate in which a SiC epitaxial layer is formed.

As a cause of deterioration in the quality of a SiC epitaxial layer, a defect with a triangular shape (hereinafter referred to as a "triangular defect") is known. A triangular defect is formed in a direction in which the apex of a triangle and its opposite side (base) are lined up sequentially in a step-flow growth direction (Non Patent Literature 3). That is, the opposite side (base) of the triangular defect is disposed in a direction perpendicular to the <11-20> direction. A plurality of causes of the triangular defect can be considered. Examples of the causes include damage such as a polishing flaw remaining on the surface of a substrate (wafer) (Patent Literature 1), a 2-dimensional nucleus formed in a terrace during step-flow growth (Patent Literature 2), a different kind of polytype of crystal nucleus formed in an interface between a substrate and an epitaxial layer at the time of an oversaturated state of an early growth stage (Non Patent Literature 1), and a minute broken piece of a SiC film to be described below. The triangular defect grows as the SiC epitaxial layer grows. That is, the triangular defect grows so that its area is increased while a shape substantially similar to a triangle using its starting point as the apex of the triangle is maintained (see the schematic diagram of FIG. 2). Accordingly, the size of the starting point is larger as the triangular occurs in the earlier growth stage of the SiC epitaxial layer, and the depth of the starting point in the layer can be estimated from the size of the triangular defect.

In order to improve a yield at the time of mass production of the SiC epitaxial wafer, reduction in the triangular defects is indispensable and Patent Literature 1 and Patent Literature 2 have suggested countermeasures against the cause for the reduction in the triangular defects.

In addition to the foregoing triangular defect, a minute broken piece (hereinafter referred to as a "downfall") of a SiC film falling on a SiC single crystal wafer or a SiC epitaxial layer is also a cause of deterioration in the quality of the SiC epitaxial layer. The downfall is peeled off from the SiC layer deposited on a sealing (top plate) disposed on the upper side of an apparatus so as to face the upper surface of a susceptor including a wafer replacing unit. This downfall can also be a starting point of the triangular defect.

Here, when the SiC epitaxial layer grows, it is necessary to heat the SiC single crystal wafer which is a substrate at a high temperature and maintain the temperature. A method of performing heating using a heating device disposed on the lower surface side of the susceptor and/or the upper surface side of the sealing is mainly used as a heating maintaining method, (see Patent Literature 3 and Non Patent Literatures 2 and 3). When the sealing is heated, a heating method of performing heating by high-frequency induction heating using an induction coil is generally used and a heating device formed of carbon suitable for the high-frequency induction heating is normally used.

While the SiC epitaxial layer is formed, SiC may be deposited not only on the SiC single crystal wafer but also on the sealing. When the layer is repeatedly formed, an amount of SiC deposited on the sealing also increases. Therefore, the problem of the downfall also becomes notable particularly in mass production.

In order to improve a yield in mass production of the SiC epitaxial wafer, reduction in the downfall is also indispensable. In order to reduce the downfall, Patent Literature 4 discloses a configuration in which a cover plate covering a wafer is disposed on a SiC single crystal wafer so that the downfall can be inhibited from falling on the SiC single crystal wafer or the SiC epitaxial layer.

CITATION LIST

Patent Literature

[Patent Literature 1]
Japanese Patent No. 4581081
[Patent Literature 2]
Japanese Unexamined Patent Application, First Publication No. 2009-256138
[Patent Literature 3]
Published Japanese Translation No. 2004-507897 of the PCT International Publication
[Patent Literature 4]
Japanese Unexamined Patent Application, First Publication No. 2009-164162
[Patent Literature 5]
Japanese Unexamined Patent Application, First Publication No. 2011-49496

Non Patent Literature

[Non Patent Literature 1]
Journal of Applied Physics 105 (2009) 074513
[Non Patent Literature 2]
Materials Science Forum Vols. 483 to 485 (2005) pp 141 to 146
[Non Patent Literature 3]
Materials Science Forum Vols. 556 and 557 (2007) pp 57 to 60

SUMMARY OF THE INVENTION

Technical Problem

However, although the methods disclosed in Patent Literatures 1 and 2 are used, a triangular defect density is not sufficiently reduced in practice. One of the reasons is existence of a triangular defect of which a cause is not well known.

Also, according to the method disclosed in Patent Literature 4, the downfall can be inhibited from falling from the sealing to the SiC single crystal wafer or the SiC epitaxial layer growing on the SiC single crystal wafer, but the depositing of SiC (or growth of a SIC film) on the sealing which is a cause of the downfall may not be inhibited. For this reason, it is necessary to clean the sealing. In this case, a problem that an apparatus operation rate is reduced may occur. Also, SiC is also deposited on the lower surface of the cover plate. Therefore, when the layer is repeatedly formed, a problem that the downfall occurs from the cover plate may occur.

The present invention is completed in light of the above-mentioned circumstances, and an object of the present invention is to provide a SiC epitaxial wafer, a SiC epitaxial wafer manufacturing method, and a SiC epitaxial wafer manufacturing apparatus with a low surface density of triangular defects having a material piece of an internal member of a chamber as a starting point.

Solution to Problem

The present inventors have first found a triangular defect having a material piece of an internal member of a chamber as a starting point. That is, the present inventors have found a new type of triangular defect, i.e., have found that a material piece of an internal member of a chamber falls on a SiC single crystal wafer or a SiC epitaxial layer during growth due to a certain cause and a triangular defect having the material piece as a starting point grows. In the related art, as described above, a polishing flaw remaining on the surface of a substrate (wafer), a different kind of polytype of crystal nucleus occurring in a step, or the like has been known as the starting point of a triangular defect. However, this found triangular defect is a triangular defect having a material piece of an internal member of a chamber as a starting point. The present inventors have found the new type of triangular defect and have carried out a thorough examination to reduce this triangular defect and have thus completed the present invention.

FIG. 1A shows a typical optical microscope image of a triangular defect having a material piece of an internal member of a chamber as a starting point. MX51 manufactured by Olympus Corporation is used as an optical microscope.

Hot Wall SiC CVD (VP 2400 HW) manufactured by AIXTRON corporation, which is an epitaxial wafer manufacturing apparatus of a (self-revolution) type having plurality of susceptors for mass production, is used and a sealing formed of graphite is used without using a shielding plate. A SiC epitaxial layer of 10 μm is formed in a 4H—SiC single crystal substrate with an off-angle of 4°. A SiC epitaxial wafer of the $80^{th}$ production lot (that is, after a film corresponding to a SiC epitaxial layer of 800 μm is formed within the chamber) is examined using an optical microscope.

When the SiC epitaxial wafer is examined using the optical microscope, normally, a defect present on a surface is examined focusing on the surface of the epitaxial layer. FIG. 1B is a diagram illustrating an optical microscope image in which the same triangular defect is examined focusing on the surface of the epitaxial layer normally.

On the other hand, the present inventors have found a foreign material (a black point ("starting point of a triangular defect") shown in the middle of a circle mark) shown black in the front (a direction distant from the opposite side) of the apex of the triangular defect by shifting the focus normally taken on the surface and focusing on an interface between a SiC single crystal substrate and an epitaxial layer. By analyzing the black point in detail and identifying the origin (a material piece of an internal member of a chamber) of the foreign material, a new type of previously unknown triangular defect having a material piece of an internal member of a chamber as a starting point has been found.

FIG. 2 is a diagram illustrating a transmission electron microscope (TEM) image obtained from the same SiC epitaxial wafer. A transmission electron microscope (HF-2200 manufactured by Hitachi High-technologies Corporation) is used.

The drawing depicted on the right side of the TEM image in FIG. 2 schematically indicates the starting point of the triangular defect and the triangular defect growing from the starting point of the triangular defect. A portion surrounded by a rectangle indicates a range shown on the TEM image and the TEM image is an examined image near the starting point of the triangular defect. The drawing depicted on the lower side of FIG. 2 schematically indicates a cross-section near the triangular defect.

The foreign material, which becomes the starting point of the triangular defect, is present in the front separate by about 7 μm from the apex of the triangle in the horizontal direction and a horizontal distance from the starting point to the opposite side of the triangle is about 143 μm.

FIG. 3 is a diagram illustrating a transmission electron microscope (TEM) image near the starting point (foreign material) of the triangular defect of the SiC epitaxial wafer manufactured under the same conditions as the manufacturing conditions in which the foregoing SiC epitaxial wafer is manufactured except that a shielding plate in which a graphite substrate is covered with a tantalum carbide (TaC) film is used on the lower surface of the sealing.

A portion of the triangular defect having the foreign material as a starting point is formed from 3C—SiC single crystal and a portion epitaxially grown normally near the triangular defect is formed from 4H—SiC single crystal.

FIG. 4A is a diagram illustrating a result obtained by performing composition analysis on the foreign material which is the starting point of the triangular defect illustrated in FIG. 3 according to an energy dispersive X-ray spectroscopy method (EDX).

In FIG. 4A, the peaks of 1.711 keV and 8.150 keV indicate tantalum (Ta). Since a member formed of a material containing tantalum (Ta) is not present within the chamber other than the shielding plate, it can be concluded that these peaks are originated from tantalum (Ta) of tantalum carbide (TaC) which is the material covering the shielding plate.

FIG. 4B is a diagram illustrating an EDX analysis result of the sample holder of the EDX. It can be understood that the peaks of Zn, Cu, and the like illustrated in FIG. 4A originate from the material of the EDX holder.

As described above, the present inventors have found a new type of triangular defect having a foreign material (material piece) coming from a material of an internal member of a chamber (a shielding plate in the case of FIG. 3) as a starting point in the front of the apex of the triangular defect (in a direction distant from the opposite side).

When the triangular defect is observed using an optical microscope or an optical surface inspection apparatus (for example, Candela manufactured by KLA-Tencor Corporation) that uses a laser beam, clear starting points and unclear starting points of the triangular defects are observed. In the related art, the fact that normal step-flow growth does not progress due to unsuitable growth conditions (for example, a considerably low growth temperature) and a different kind of polytype of crystal nucleus becomes a starting point has been analyzed as a cause of the triangular defect with the unclear starting point in many cases. On the other hand, the present inventors have found that an origin of a material piece of an internal member of a chamber is present in a triangular defect with an unclear starting point. At the moment, it may not be concluded that all of the triangular defects with unclear starting points come from material pieces of an internal member of a chamber. As will be described below, however, almost all of the triangular defects with unclear starting points have successfully been removed by reducing the triangular defects coming from the material pieces of the internal member of the chamber. Accordingly, most of the triangular defects with the unclear starting points are considered to come from the material pieces of the internal member of the chamber.

Whether a triangular defect with an unclear starting point is the triangular defect having the material piece of the internal member of the chamber as the starting point can be identified according to, for example, a method of shifting focus from a surface in a depth direction using an optical microscope, as described above. Therefore, a surface density of the triangular defects having the material piece of the internal member of the chamber as the starting point can be obtained.

Deterioration in the internal member of the chamber progresses as films are repeatedly formed (a production lot number increases), and thus the amount of falling material piece increases. Therefore, the surface density of the triangular defects having the material piece of the internal member of the chamber as the starting point increases. Here, as a specific example of the deterioration in the internal member of the chamber, since a coefficient of thermal expansion is different between a tantalum film and a graphite substrate in the case of a sealing in which the graphite substrate is covered with the tantalum carbide (TaC) film, stress is applied to a tantalum carbide film and the tantalum carbide film is peeled off due to an increase and a decrease in temperature by the repetition of the forming of the films. As other examples, the tantalum carbide film is cracked and dust emission from the crack occurs in the graphite substrate, and the material of the sealing is sublimated due to mutual interaction between a gas within the chamber and the surface of the sealing. Also, when SiC is deposited on the sealing and a SiC film grows, a difference in the coefficient of thermal expansion between the SiC film and the tantalum carbide film causes deterioration in the tantalum carbide film. Thus, the surface density of the triangular defects having the material piece of the internal member of the chamber as the starting point highly depends on the number of times the film is formed (or a production lot number). Also, when the number of times the film is formed exceeds a predetermined number of times (depending on a manufacturing condition), deterioration in the internal member of the chamber progresses at once and the surface density of the triangular defects having the material piece of the internal member of the chamber as the starting point sharply increases.

On the other hand, a triangular defect having damage, such as a polishing flaw of a surface of a substrate (wafer), as a starting point or a triangular defect having a different kind of polytype of crystal nucleus formed due to unsuitable growth conditions as a starting point does not depend on the number of times the film is formed. That is, a triangular defect caused by a substrate or a triangular defect caused due to a growth condition does not depend on the number of times the film is formed.

On the other hand, a triangular defect having a downfall as a starting point also depends on the number of times the film is formed. The downfall falls from the sealing when the shielding plate is not used. The downfall falls from the shielding plate when the shielding plate is used. When the film is repeatedly formed, the SiC film formed on the sealing or the shielding plate is thicker, and thus is easily peeled off. When the shielding plate is used, as will be described below, the lower surface of the shielding plate is preferably formed of a material with a higher attachment property of the SiC film than that of the sealing. Accordingly, the downfall can be reduced compared to the case in which the shielding plate is not used.

Accordingly, examples of the triangular defect increasing by the repetition of the forming of the film include not only the triangular defect having the material piece of the internal member of the chamber as the starting point but also the triangular defect having the downfall as the starting point. The triangular defect having the material piece of the internal member of the chamber as the starting point has characteristics in which the starting point is unclear in an optical microscope image or an image (hereinafter referred to as a candela image) produced by an optical surface inspection apparatus using a laser beam, whereas a starting point is clear for the triangular defect having the downfall as the starting point. Accordingly, each triangular defect can normally be identified from an optical microscope image, a candela image, or the like. Even when a defect coming from a cause other than the downfall is included in the triangular defect with an unclear starting point, the surface density of the triangular defects with the unclear starting point can be considered to be the upper limit of the surface density of the triangular defects having the material piece of the internal member of the chamber as the starting point. Accordingly, by managing the surface density, it is possible to manage the upper limit of the surface density of the triangular defects having the material piece of the internal member of the chamber as the starting point. By managing an increase in the surface density of the triangular defects with the unclear starting point due to the repetition of the forming of the film, it is possible to manufacture a SiC epitaxial wafer in which the surface density of the triangular defects having the material piece of the internal member of the chamber as the starting point is low.

When the density of the triangular defects having the material piece of the internal member of the chamber as the starting point is desired to be more precisely measured and managed, the precise measurement can be taken by performing composition analysis of a foreign material present in the front of the triangular defect using energy dispersive X-ray spectroscopy or the like.

In the SiC epitaxial wafer manufacturing apparatus, the internal member of the chamber deteriorates due to the repetition of the forming of the film and is peeled off from the surface of the like, and thus a minute lump occurs. When the minute lump falls on the wafer or the SiC epitaxial layer during growth, a material piece of the internal member of the chamber, which becomes a starting point of a triangular defect, is considered to occur. The internal member of the chamber which causes the material piece serving as the starting point of the triangular defect is mainly a member disposed on the upper side of the wafer. An amount of material piece falling on the wafer from other wall surfaces of the chamber or other members within the chamber is estimated to be negligible.

Accordingly, to reduce the triangular defect having the material piece of the internal member of the chamber as the starting point, the present inventors have contrived a technique for covering a member disposed on the upper side of a wafer to face the wafer with a material by which dust emission or sublimation is small, a technique for measuring the surface density of the triangular defects having a material piece of an internal member of a chamber as a starting point regularly (for each production lot, every plurality of production lots, or the like) or irregularly and managing the value of the surface density, and a technique for manufacturing a subsequent SiC epitaxial wafer after the member is replaced when the surface density is greater than a predetermined value. Thus, the present inventors have found that a SiC epitaxial wafer with a low surface density of the triangular defects having a material piece of an internal member of a chamber as a starting point can be manufactured.

As described above, the present inventors have consequently been contrived the present invention including the following means by finding the existence of a new type of triangular defect having a material piece of an internal member of a chamber as a starting point and executing a thorough study on a task of reduction in the triangular defect.

The present inventers provide the following invention to resolve the above-mentioned problems.

(1) A SiC epitaxial wafer including:
a SiC epitaxial layer formed on a SiC single crystal substrate with an off-angle, wherein
a surface density of triangular defects, which is present in the SiC epitaxial layer and has a material piece of an internal member of a chamber as a starting point, is 0.5 pieces/cm$^2$ or less.

In the present invention, the SiC single crystal substrate means a SiC single crystal wafer.

(2) The SiC epitaxial wafer according to (1), wherein the material piece, which becomes a starting point, is formed of carbon or silicon carbide.

(3) A SiC epitaxial wafer manufacturing method including:
manufacturing a SiC epitaxial wafer including a SiC epitaxial layer on a surface of a SiC single crystal wafer while supplying a raw material gas into a chamber using a SiC epitaxial wafer manufacturing apparatus; and
manufacturing a subsequent SiC epitaxial wafer after measuring a surface density of triangular defects having a material piece of an internal member of the chamber as a starting point on the SiC epitaxial layer of the previously manufactured SiC epitaxial wafer, wherein
the SiC epitaxial wafer manufacturing apparatus includes a susceptor that includes a wafer placement unit on which the wafer is placed, a top plate that is disposed to face an upper surface of the susceptor so that a reaction space is formed between the susceptor and the top plate, and a shielding plate that is disposed to be close to a lower surface of the top plate to such an extent that a deposit is prevented from being attached to the lower surface of the top plate, and
the shielding plate is formed of silicon carbide or a surface of the shielding plate facing the susceptor is covered with a silicon carbide film or a pyrolytic carbon film.

(4) The SiC epitaxial wafer manufacturing method according to (3), wherein the shielding plate is replaced and the subsequent SiC epitaxial wafer is manufactured when the surface density of the triangular defects having the material piece of the internal member of the chamber as the starting point is greater than a predetermined density as a result of the measurement.

(5) A SiC epitaxial wafer manufacturing method including:
manufacturing a SiC epitaxial wafer including a SiC epitaxial layer on a surface of a SiC single crystal wafer while supplying a raw material gas into a chamber using a SiC epitaxial wafer manufacturing apparatus; and
manufacturing a subsequent SiC epitaxial wafer after measuring a surface density of triangular defects having a material piece of an internal member of the chamber as a starting point on the SiC epitaxial layer of the previously manufactured SiC epitaxial wafer, wherein
the SiC epitaxial wafer manufacturing apparatus includes a susceptor that includes a wafer placement unit on which the wafer is placed and a top plate that is disposed to face an upper surface of the susceptor so that a reaction space is formed between the susceptor and the top plate, and
the top plate is formed of silicon carbide or a surface of the top plate facing the susceptor is covered with a silicon carbide film or a pyrolytic carbon film.

(6) The SiC epitaxial wafer manufacturing method according to (5), wherein the top plate is replaced and the subsequent SiC epitaxial wafer is manufactured when the surface density of the triangular defects having the material piece of the internal member of the chamber as the starting point is greater than a predetermined density as a result of the measurement.

(7) A SiC epitaxial wafer manufactured using the SiC epitaxial wafer manufacturing method according to any one of (3) to (6).

(8) A SiC epitaxial wafer manufacturing apparatus including:
a susceptor that includes a wafer placement unit on which a wafer is placed;
a top plate that is disposed to face an upper surface of the susceptor so that a reaction space is formed between the susceptor and the top plate; and
a shielding plate that is disposed to be close to a lower surface of the top plate to such an extent that a deposit is prevented from being attached to the lower surface of the top plate, wherein
the shielding plate is formed of silicon carbide or a surface of the shielding plate facing the susceptor is covered with a silicon carbide film or a pyrolytic carbon film, and
an epitaxial layer is formed on a surface of the wafer while a raw material gas is supplied into a chamber.

(9) A SiC epitaxial wafer manufacturing apparatus including:
a susceptor that includes a wafer placement unit on which a wafer is placed; and
a top plate that is disposed to face an upper surface of the susceptor so that a reaction space is formed between the susceptor and the top plate, wherein
the top plate is formed of silicon carbide or a surface of the top plate facing the susceptor is covered with a silicon carbide film or a pyrolytic carbon film, and an epitaxial layer is formed on a surface of the wafer while a raw material gas is supplied into a chamber.

(10) The epitaxial wafer manufacturing apparatus according to (8) or (9), wherein a film thickness of the silicon carbide film or the pyrolytic carbon film is within the range of 20 μm to 100 μm.

(11) The epitaxial wafer manufacturing apparatus according to any one of (8) to (10), further including: a heating device that is disposed on a lower surface side of the susceptor and/or an upper surface side of the top plate.

Advantageous Effects of Invention

In the SiC epitaxial wafer of the present invention, the surface density of the triangular defects having the material piece of the internal member of the chamber as the starting point, which results from a previously unknown cause and thus may not be reduced, is low as 0.5 pieces/cm$^2$ or less. Therefore, a larger number of devices than in the related art can be obtained from one SiC epitaxial wafer.

The SiC epitaxial wafer manufacturing method of the present invention includes the manufacturing of the subsequent SiC epitaxial wafer after measuring the surface density of the triangular defects having the material piece of the internal member of the chamber as the starting point on the SiC epitaxial layer of the previously manufactured SiC epitaxial wafer by using the SiC epitaxial wafer including the shielding plate. Therefore, it is possible to manufacture the SiC epitaxial wafer for which the triangular defect having the material piece of the internal member of the chamber as the starting point is small in the SiC epitaxial layer. Also, the shielding plate is formed of silicon carbide or the surface of the shielding plate facing the susceptor is covered with the silicon carbide film or the pyrolytic carbon film. Therefore, the deterioration in the shielding plate hardly progresses, the material pieces falling from the shielding plate to the wafer are reduced, and thus the shielding plate can be used longer. When the shielding plate covered with the silicon carbide film and formed of silicon carbide is used, the SiC film deposited on the shielding plate is the same as the covered film or the material is the same, there is no difference in the coefficient of thermal expansion, and therefore the deterioration hardly progresses. Also, when the shielding plate covered with the pyrolytic carbon film is used, the shielding plate formed of a carbon material substrate is used. Since a difference in the coefficient of thermal expansion is small between the carbon material substrate and the pyrolytic carbon film, the deterioration in the shielding plate hardly progresses.

According to the SiC epitaxial wafer manufacturing method of the present invention, when the surface density of the triangular defects having the material piece of the internal member of the chamber as the starting point is greater than the predetermined density as the result of the foregoing measurement, the shielding plate is replaced and a subsequent SiC epitaxial wafer is configured to be manufactured. Therefore, it is possible to manufacture the SiC epitaxial wafer in which the surface density of the triangular defects having the material piece of the internal member of the chamber as the starting point is equal to or less than the predetermined surface density.

The SiC epitaxial wafer manufacturing method of the present invention includes the manufacturing of the subsequent SiC epitaxial wafer after measuring the surface density of the triangular defects having the material piece of the internal member of the chamber as the starting point on the SiC epitaxial layer of the previously manufactured SiC epitaxial wafer. Therefore, it is possible to manufacture the SiC epitaxial wafer in which the triangular defect having the material piece of the internal member of the chamber as the starting point is small in the SiC epitaxial layer. Also, the top plate is formed of silicon carbide or the surface of the top plate facing the susceptor is covered with the silicon carbide film or the pyrolytic carbon film. Therefore, the deterioration in the top plate hardly progresses, the material pieces falling from the top plate to the wafer are reduced, and thus the top plate can be used longer. When the top plate covered with the silicon carbide film and formed of silicon carbide is used, the SiC film deposited on the top plate is the same as the covered film of the top plate or the material is the same, there is no difference in the coefficient of thermal expansion, and therefore the deterioration hardly progresses. Also, when the top plate covered with the pyrolytic carbon film is used, the top plate of a carbon material substrate is used. Since a difference in the coefficient of thermal expansion is small between the carbon material substrate and the pyrolytic carbon film, the deterioration in the top plate hardly progresses.

According to the SiC epitaxial wafer manufacturing method of the present invention, the top plate is replaced and the subsequent SiC epitaxial wafer is manufactured when the surface density of the triangular defects having the material piece of the internal member of the chamber as the starting point is greater than the predetermined density as the result of the foregoing measurement. Therefore, it is possible to manufacture the SiC epitaxial wafer in which the surface density of the triangular defects having the material piece of the internal member of the chamber as the starting point is equal to or less than the predetermined surface density.

The SiC epitaxial wafer manufacturing apparatus of the present invention includes the shielding plate that is disposed to be close to the lower surface of the top plate so that a deposit is prevented from being attached to the lower surface of the top plate and dust emitted from the lower surface of the top plate is received. Since the shielding plate is formed of silicon carbide or the surface of the shielding plate facing the susceptor is covered with the silicon carbide film or the pyrolytic carbon film, the material pieces falling from the shielding plate to the wafer are reduced. Accordingly, it is possible to manufacture the SiC epitaxial wafer with the low surface density of the triangular defects having the material piece of the internal member of the chamber as the starting point.

In the SiC epitaxial wafer manufacturing apparatus of the present invention, the top plate is formed of silicon carbide or the surface of the top plate facing the susceptor is covered with the silicon carbide film or the pyrolytic carbon film. Therefore, the material pieces falling from the top plate to the wafer are reduced. Accordingly, it is possible to manufacture the SiC epitaxial wafer with the low surface density of the triangular defects having the material piece of the internal member of the chamber as the starting point.

DESCRIPTION OF EMBODIMENTS

Figure 1A:
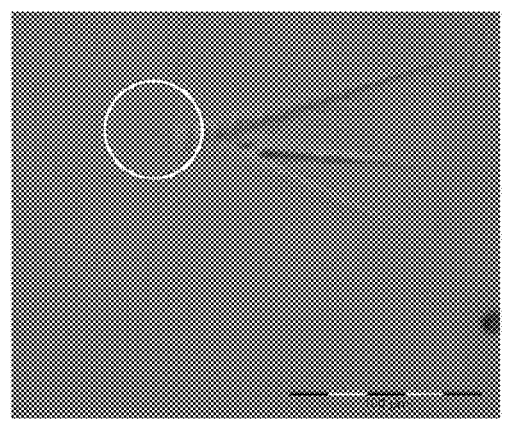
FIG. 1A is a diagram illustrating an optical microscope image of a triangular defect having a material piece of an internal member of a typical chamber as a starting point and examined focusing on a foreign material.
Figure 1B:
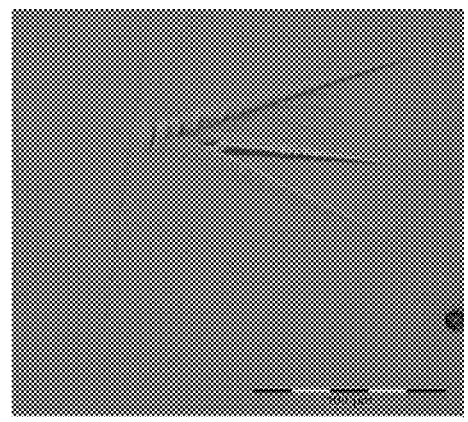
FIG. 1B is a diagram illustrating an optical microscope image of a triangular defect having a material piece of an internal member of a typical chamber as a starting point and examined focusing on the surface of an epitaxial layer.
Figure 2:
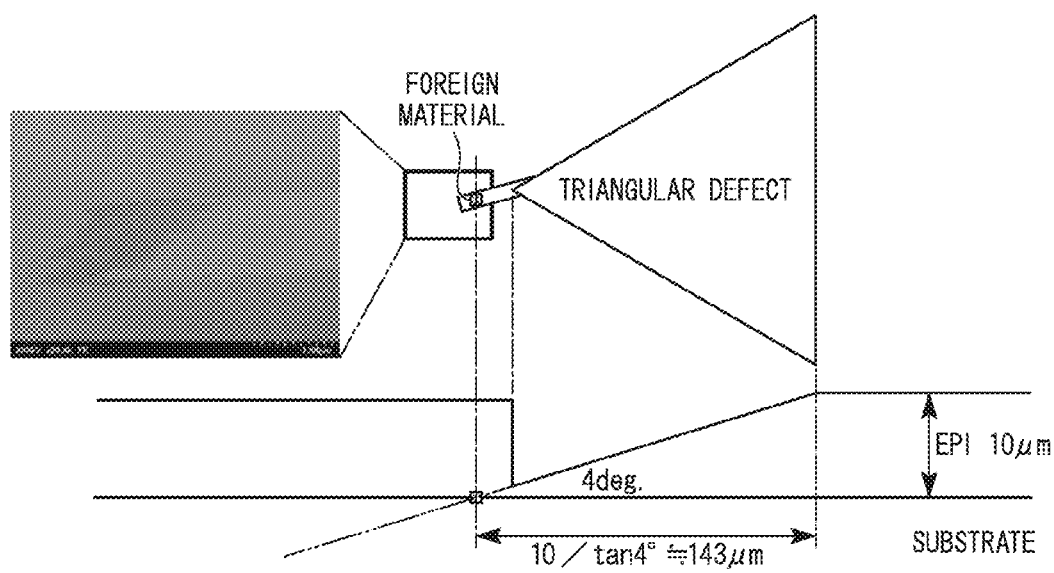
FIG. 2 is a diagram illustrating a transmission electron microscope (TEM) image of the same SiC epitaxial wafer as those of FIGS. 1A and 1B.
Figure 3:
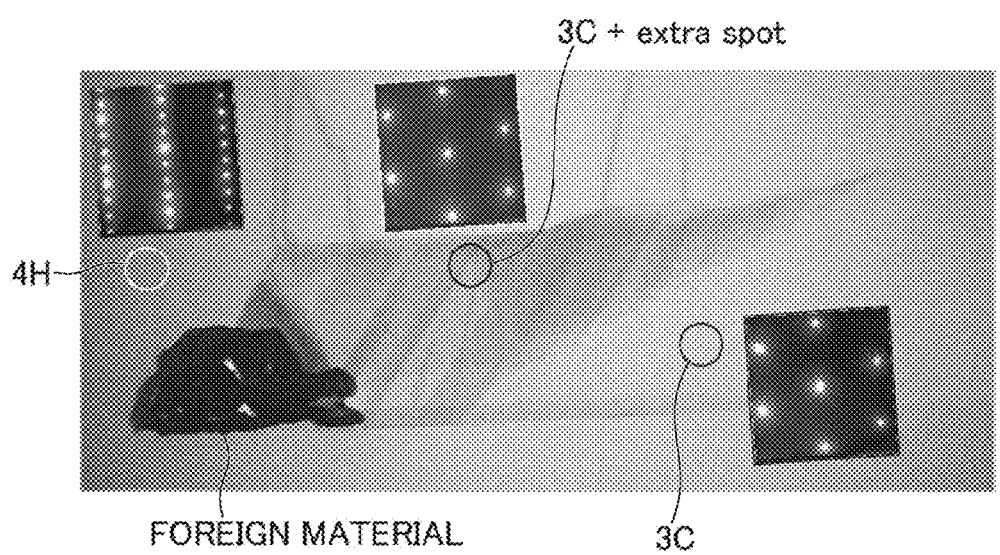
FIG. 3 is a diagram illustrating a transmission electron microscope (TEM) image of a SiC epitaxial wafer manufactured using a shielding plate formed of graphite covered with a tantalum carbide film.
Figure 4A:
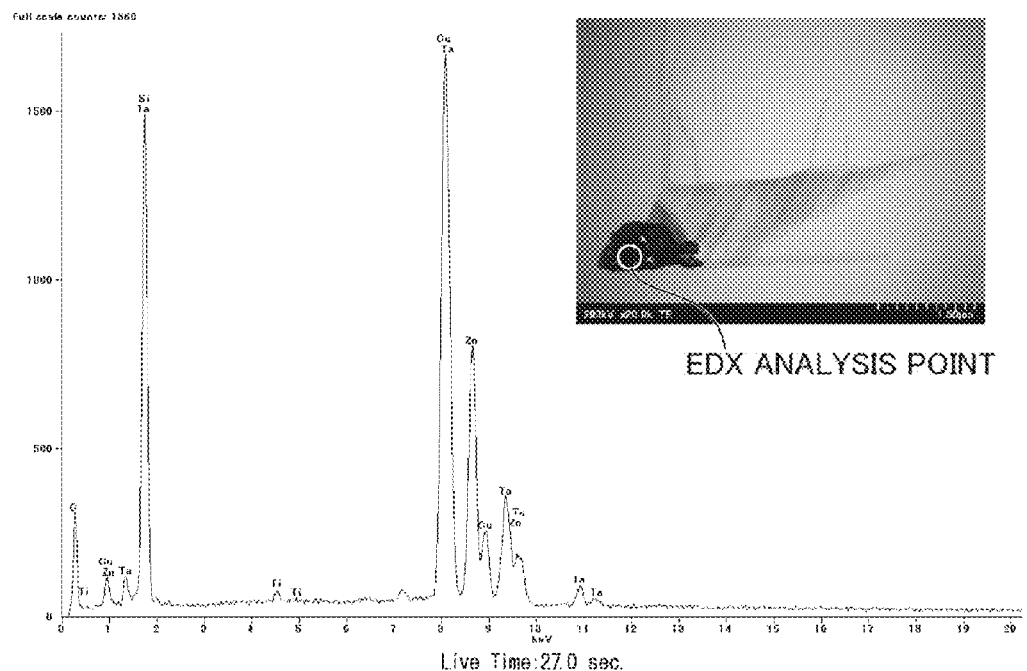
FIG. 4A is a diagram illustrating a measurement result according to energy dispersive X-ray spectroscopy of the same SiC epitaxial wafer as that of FIG. 3 and a result obtained by measuring a foreign material.
Figure 4B:
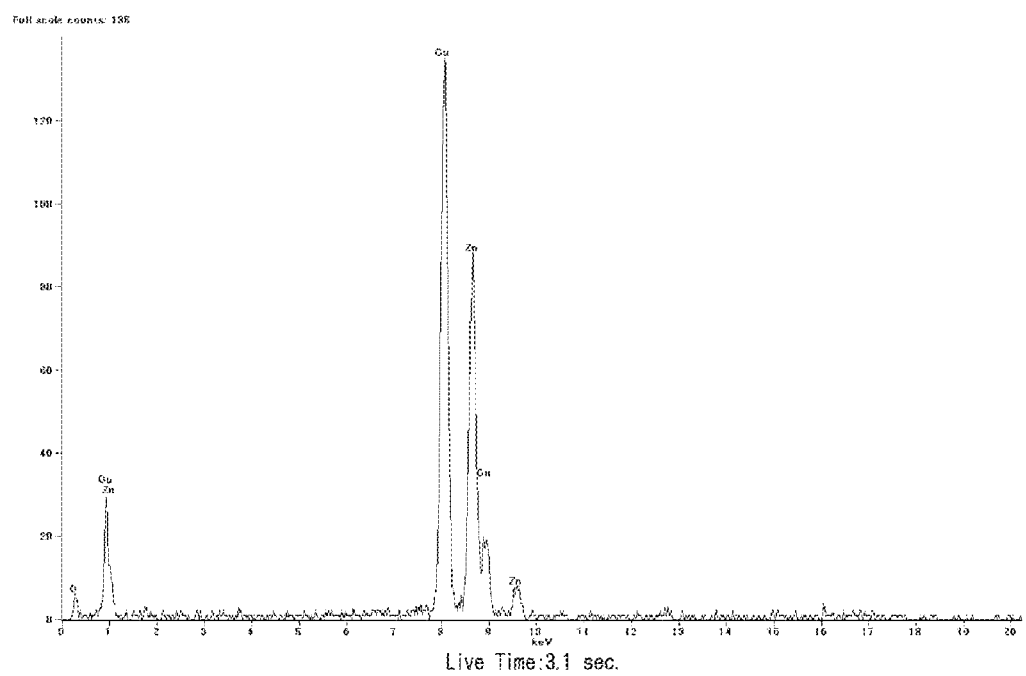
FIG. 4B is a diagram illustrating a measurement result according to energy dispersive X-ray spectroscopy of the same SiC epitaxial wafer as that of FIG. 3 and a result obtained by measuring a sample holder.

Hereinafter, a SiC epitaxial wafer, a SiC epitaxial wafer manufacturing method, and an epitaxial wafer manufacturing apparatus to which the present invention is applied will be described in detail with reference to the drawings.

In the drawings used for the following description, characteristic portions are expanded to facilitate the understanding of the characteristics in some cases, and thus dimension scales and the like of respective constituent elements are different from the actual scales and the like in some cases. Materials, dimensions, and the like exemplified in the following description are examples, and thus the present invention is not limited thereto and may be appropriately modified within the scope of the present invention without departing from the gist of the present invention.

[SiC Epitaxial Wafer]

A SiC epitaxial wafer to which the present invention is applied is a SiC epitaxial wafer that includes a SiC epitaxial layer on a SiC single crystal substrate having an off-angle and is characterized in that a surface density of triangular defects having a material piece of an internal member of a chamber as a starting point is 0.5 pieces/cm$^2$.

Since the triangular defect having the material piece of the internal member of the chamber as the starting point is not a triangular defect caused by a substrate, the substrate is not particularly limited to a SiC single crystal substrate.

Since any polytype can be used as the SiC single crystal substrate, 4H—SiC mainly used to manufacture a practical SiC device can be used. A SiC single crystal substrate processed from a bulk crystal produced by a sublimation method or the like is used as a substrate of the SiC device. Typically, a SiC epitaxial layer serving as an active region of the SiC device is formed on the SiC single crystal substrate according to chemical vapor deposition (CVD).

Any off-angle may be used as the off-angle of the SiC single crystal substrate. Although the off-angle is not limited, a small off-angle of, for example, 0.4° to 5° is preferable from the viewpoint of cost reduction. The angle of 0.4° is the lower limit of the off-angle at which step-flow growth can be realized.

When the SiC single crystal substrate has a size up to about 2 inches, 8° has mainly been used as the off-angle of the SiC single crystal substrate. At this off-angle, a terrace width of the wafer surface is small and the step-flow growth can easily be realized. However, the number of wafers obtained from a SiC ingot decreases as the off-angle increases. Therefore, an off-angle of about 4° is mainly used in a SiC substrate of 3 inches or more.

As the off-angle decreases, the terrace width of the surface of the SiC single crystal substrate increases. Therefore, a speed at which migration atoms are taken at a step end, that is, a growth speed of the step end, may easily become irregular. As a result, step bunching may easily occur since a step of a fast growth speed catches up with a step of a slow growth speed to be coalesced. For example, in a substrate of the off-angle of 0.4°, the terrace width is 10 times the terrace width of the substrate of the off-angle of 4°, and thus a length of the step-flow growth is increased by a single digit. Accordingly, it is necessary to notice that the condition of the step-flow growth used in the substrate of the off-angle of 4° is required to be adjusted.

A SiC single crystal substrate in which the growth surface of the SiC epitaxial layer is processed with a convex shape can be used.

When the SiC epitaxial wafer is manufactured (the SiC epitaxial layer is formed (grows)), the rear surface of the SiC single crystal substrate is heated directly from a heated susceptor. However, the front surface (the surface on which the SiC epitaxial layer is formed) is exposed to a vacuum space, and thus is not heated directly. Also, since hydrogen which is a carrier gas flows on the front surface, the heat is carried away. From this circumstance, the temperature of the front surface is lower than that of the rear surface at the time of epitaxial growth. Due to a difference in the temperature, the magnitude of thermal expansion of the front surface is lower than that of the rear surface, and the front surface of the SiC single crystal substrate is deformed to become concave at the time of epitaxial growth. Accordingly, by using the SiC single crystal substrate in which the growth surface of the SiC epitaxial layer is processed with a convex shape, the epitaxial growth can be performed in a state in which the concaveness (warping) of the substrate at the time of the epitaxial growth is resolved.

The thickness of the SiC epitaxial layer is not particularly limited. However, for example, when the layer is formed in 2.5 hours at a typical growth speed of 4 μm/h, the thickness of the SiC epitaxial layer becomes 10 μm.

SiC Epitaxial Wafer Manufacturing Apparatus
(First Embodiment)

Figure 5:
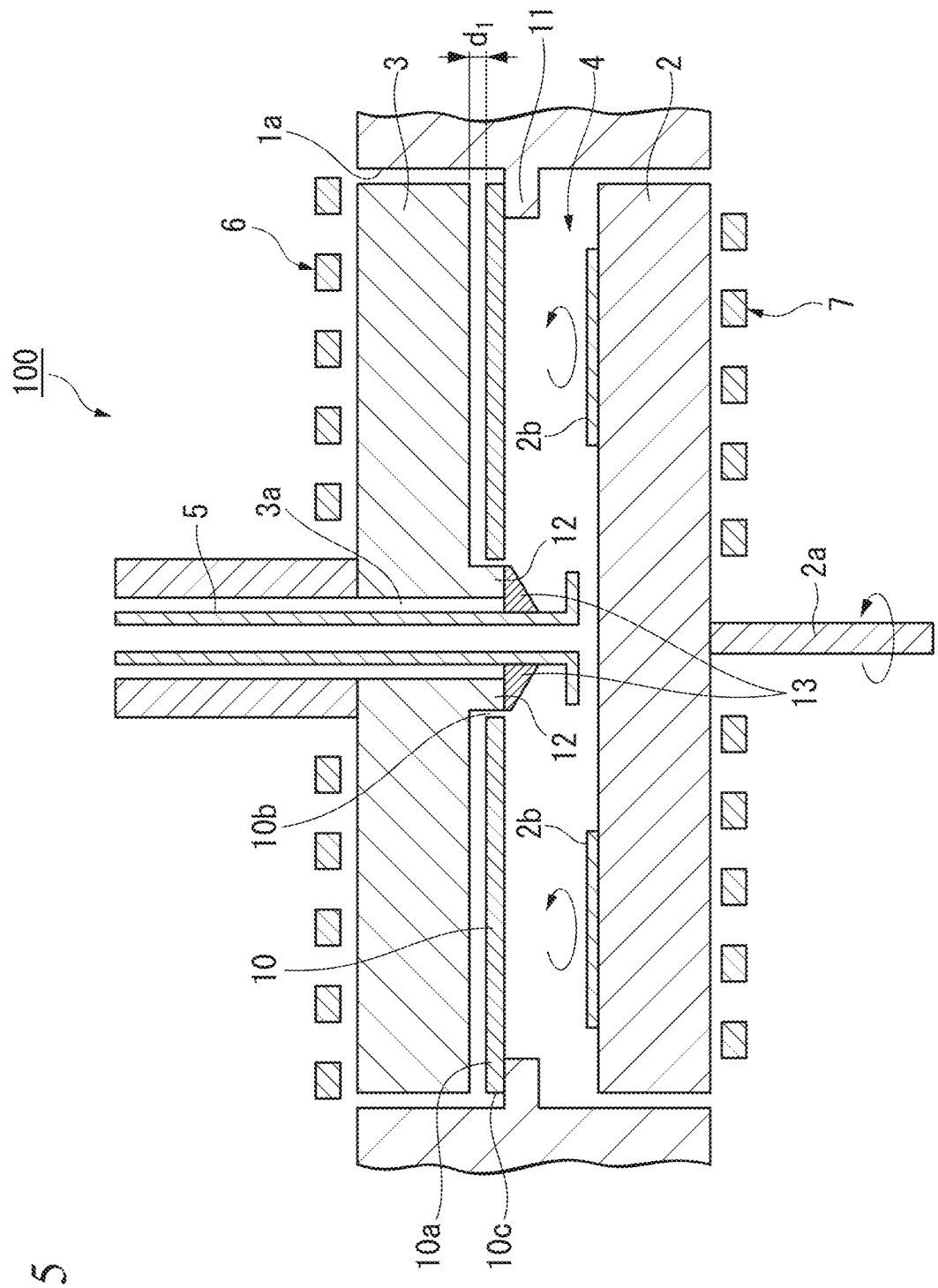
FIG. 5 is a schematic sectional view illustrating an epitaxial wafer manufacturing apparatus used in an embodiment of the present invention.
Figure 6:
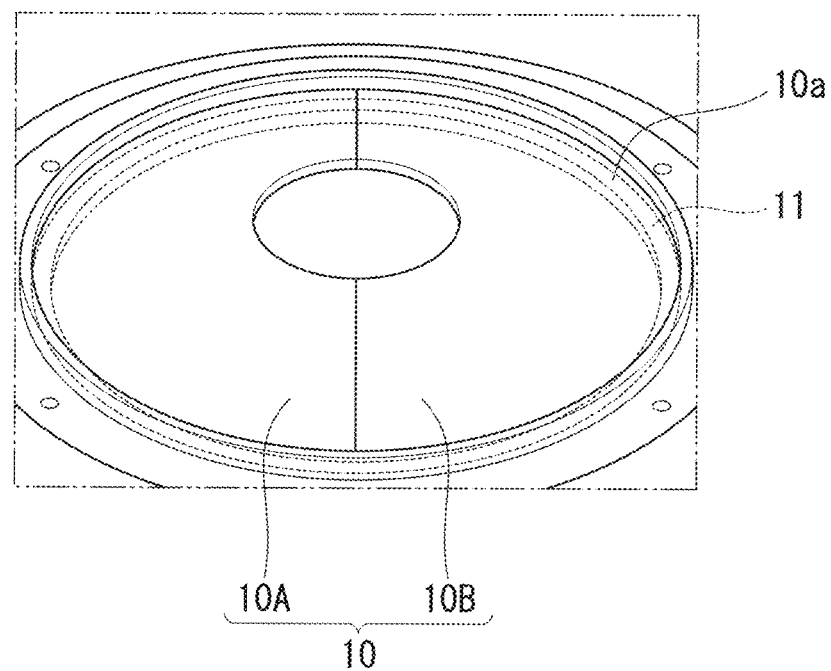
FIG. 6 is a perspective view illustrating a lower side of the epitaxial wafer manufacturing apparatus taken along the line A-A' of FIG. 5.
Figure 7:
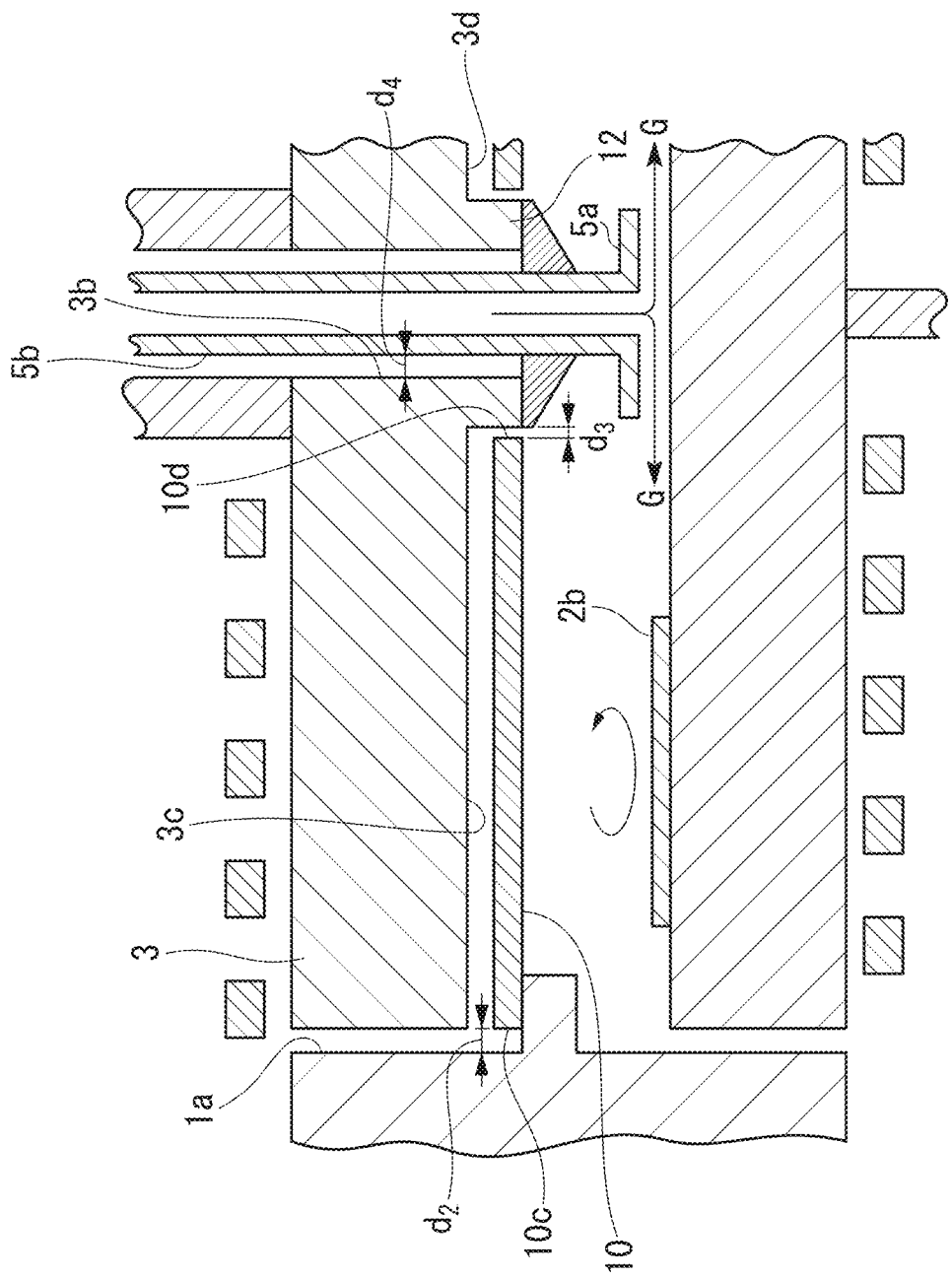
FIG. 7 is a schematic expanded view of the periphery of a shielding plate shown in FIG. 5.

FIG. 5 is a schematic sectional view illustrating a part of an epitaxial wafer manufacturing apparatus to which the present invention is applied. FIG. 6 is a perspective view illustrating a lower side of the epitaxial wafer manufacturing apparatus taken along the line A-A' of FIG. 5. FIG. 7 is a schematic expanded view of the periphery of a shielding plate shown in FIG. 5.

An epitaxial wafer manufacturing apparatus 100 according to an embodiment herein is, for example, a CVD apparatus 100 illustrated in FIG. 5. Specifically, the epitaxial wafer manufacturing apparatus 100 includes a plurality of placement units 2b on which a wafer is placed, a susceptor 2 for which the plurality of placement units 2b are arranged in tandem in a circumferential direction, a sealing (top plate) 3 disposed to face the upper surface of the susceptor 2 so that a reaction space 4 is formed in a space between the susceptor 2 and the sealing 3, and a shielding plate 10 disposed to be close to the lower surface of the sealing 3 to the extent that deposits in a gaseous phase are prevented from being deposited on the lower surface of the sealing 3. The shielding plate 10 is formed of silicon carbide or the surface of the shielding plate 10 facing the susceptor 2 is covered with a silicon carbide film or a pyrolytic carbon film. The epitaxial wafer manufacturing apparatus 100 forms an epitaxial layer on a surface of a wafer while supplying a raw material gas into a chamber 1.

As the raw material gas, for example, a gas in which silane ($SiH_4$) included in a Si source or propane ($C_3H_8$) included in a C source can be used. Also, a gas containing hydrogen ($H_2$) can be used as a carrier gas.

The epitaxial wafer manufacturing apparatus 100 according to the embodiment includes heating devices 6 and 7 that are disposed on the lower surface side of the susceptor 2 and on the upper surface side of the sealing and heat wafers places on the placement units 2b, and includes a gas introduction pipe 5 that has a gas introduction port through which a raw material gas is introduced from the middle portion of the upper surface of the sealing 3 to the reaction space 4 and supplies the raw material gas discharged from the gas introduction from the inside of the reaction space 4 to the outside thereof.

The heating devices 6 and 7, which are induction coils, can heat the sealing 3 through high-frequency induction heating of the induction coils, heat the shielding plate 10 through radiation heat from the heated sealing 3, and heat the wafers through radiation heat from the shielding plate 10.

In the embodiment, a wafer is configured to be heated using the heating devices disposed on the lower surface side of the susceptor 2 and on the upper surface side of the sealing, but the heating devices may be configured to be disposed only on the lower surface side of the susceptor 2.

The heating device of a SiC single crystal substrate is not limited to the above-described high-frequency induction heating, but heating devices of resistance heating or the like may be used.

The sealing 3 includes a protrusion portion 12 that is installed in the middle portion of the lower surface to protrude and be located inside an opening 10b of the shielding plate 10. The sealing 3 is held by holding members 13 fixed to the gas introduction pipe 5 via the protrusion portion 12. Due to the protrusion portion 12, the gas hardly flows toward the gap between the shielding plate 10 and the sealing 3 from the inner circumferential side of the shielding plate 10.

A sealing formed of a carbon material such as graphite or silicon carbide or a sealing formed such that a substrate of a carbon material is covered with a film of SiC, pyrolytic carbon, TaC, or the like can be used as the sealing 3. The sealing 3 is preferably formed of a material which is hardly sublimated by dust emission under a high temperature or mutual interaction with the gas within the chamber.

The shielding plate 10 is configured to be detachably mounted within the chamber. In the embodiment, the outer circumference portion 10a is placed on a holding unit 11 installed on the inner wall surface of the chamber.

The shielding plate 10 can be detachably mounted within the chamber, while avoiding contact between the gas introduction pipe 5 which is at a low temperature to introduce the raw material gas in a non-resolved state and the inner circumferential portion (the middle portion in which the opening is formed) of the shielding plate 10 by holding only the outer circumferential portion of the shielding plate 10, compared to the shielding plate 10 which is heated by heating devices at a high temperature.

The shielding plate 10 is preferably divided into a plurality of portions. The shielding plate 10 according to the embodiment is formed by one pair of members 10A and 10B divided as two portions along the middle line, as illustrated in FIG. 6. In this case, each of one pair of members 10A and 10B can be placed on the holding unit 11. At the time of exchange, the members may be detached one by one from the holding unit 11. Accordingly, operability is good and a damage risk is reduced at the time of placement, exchange, and maintenance.

Also, when the shielding plate 10 is divided into a plurality of portions, heat stress is alleviated, and thus a curved state or deformation occurrence is suppressed.

The shielding plate 10 normally prevents dust (graphite) occurring from the lower surface of the sealing 3 formed of graphite from falling to the wafer, thereby reducing a surface density of triangular defects having a material piece of the sealing as a starting point. However, when a material piece of the shielding plate 10 falls to the wafer, a triangular defect having the material piece of the shielding plate 10 as a starting point is formed. To suppress the material piece from falling, the shielding plate 10 is required to be formed of a material which is hardly sublimated by dust emission under a higher temperature than the material of the sealing 3 or mutual interaction with the gas within the chamber. For this reason, a shielding plate formed of silicon carbide or a shielding plate in which a graphite substrate is covered with a silicon carbide film or a pyrolytic carbon film is used as the shielding plate 10.

The film thickness of the silicon carbide film or the pyrolytic carbon film is preferably 20 μm or more from the viewpoint of the suppression of deterioration. Also, the film thickness is preferably 100 μm or less from the viewpoint of reduction in stress based on a difference in a coefficient of thermal expansion with the graphite substrate.

To reduce an amount of downfall falling on a SiC single crystal wafer or a SiC epitaxial layer since a SiC film in a gaseous phase is deposited and the deposited SiC film is peeled off, at least the lower surface of the shielding plate 10 is preferably formed of a material with high attachment of the SiC film. An example of this material includes silicon carbide. Also, the lower surface of the shielding plate 10 may be covered with a silicon carbide film.

In the embodiment, since the shielding plate 10 is required to receive heat radiation from the sealing 3, be heated, emit the radiation heat, and heat the wafer, the material of the shielding plate 10 preferably has high thermal conductivity.

When the shielding plate 10 is formed of silicon carbide, the shielding plate 10 can be manufactured by a chemical vapor deposition (CVD) method, sintering, or the like. However, when a CVD method is used, a shielding plate formed of a high-purity material can be manufactured. Since the surface of the shielding plate 10 on which silicon carbide is deposited has high attachment of silicon carbide, the surface thereof is preferably roughened by polishing or the like.

The thickness of the shielding plate 10 is preferably within the range of 2 mm to 6 mm from the viewpoint of prevention of cracking. This is because the shielding plate 10 is easily cracked. That is, when the thickness is thinner than 2 mm, the shielding plate 10 is too flexible (bent) and is cracked. When the thickness is thicker than 6 mm, the shielding plate 10 is also cracked.

When the sealing is formed of silicon carbide, even the same material can be resistant to thermal strain by thinning the thickness of the shielding plate 10 to be thinner than the sealing, and thus the cracking hardly occurs.

The plurality of placement units 2b are arranged in tandem in the circumferential direction on the disk-like susceptor 2 so as to surround the middle portion of the susceptor 2. A rotary shaft 2a for revolution is mounted in the middle portion of the lower surface of the susceptor 2. The rotary shaft 2a for revolution is disposed immediately below the gas introduction pipe 5. A rotary shaft (not illustrated) for rotation is mounted on each placement unit 2b.

In such a configuration, the susceptor 2 resolves each SiC single crystal wafer by using the gas introduction pipe 5 as a central axis, and each SiC single crystal wafer itself is rotated along with each placement unit 2b using the center of the SiC single crystal wafer as an axis.

In the SiC epitaxial wafer manufacturing apparatus, since a cool gas is introduced from the gas introduction pipe 5 disposed at the middle portion and the induction heat is rarely added to the middle portion of the susceptor 2, the temperature of the susceptor 2 is generally lower at a portion closer to the middle portion. Due to this effect, the temperature of the outer circumferential portion of the rotating placement unit 2b, i.e., the temperature of the outer circumferential portion of the SiC single crystal wafer installed on the placement unit 2b, is lowered. For this reason, in a general susceptor-type epitaxial growth apparatus, the installed SiC single crystal wafer has a temperature gradient in which the temperature of the wafer middle portion is the highest and the temperature decreases toward the wafer outer circumferential portion. The temperature gradient of the SiC single crystal wafer causes compressible stress in the middle portion of the SiC single crystal wafer during epitaxial growth.

A flange portion 5a protruding in a diameter expansion direction is installed in a front end portion (lower end portion) of the gas introduction pipe 5. The flange portion 5a is configured to flow a raw material gas G discharged vertically downward from the lower end portion of the gas introduction pipe 5 radially in the horizontal direction in a space with the facing susceptor 2.

In the CVD apparatus 100, the raw material gas G can be supplied in parallel to the in-plane of the SiC single crystal substrate by flowing the raw material gas G discharged from the gas introduction pipe 5 radially outward from the inside of the reaction space 4. Also, the gas unnecessary within the chamber can be discharged from a discharge port (not illustrated) installed in a wall of the chamber to the outside of the chamber.

Here, the sealing 3 is heated at a high temperature by the foregoing induction coils 7, but the inner circumferential portion (the middle portion in which the opening 10b is formed) does not come in contact with the gas introduction pipe 5 which is at a low temperature to introduce the raw material gas G. Also, the sealing 3 is held in the upward vertical direction since the inner circumferential portion thereof is placed on the holding member 13 attached to the outer circumferential portion of the gas introduction pipe 5. The sealing 3 can be moved vertically.

The temperature gradient of the SiC single crystal wafer varies due to a flow rate of the gas to be introduced or a change in the positions of the induction heating coils. In the embodiment, the flow rate of the gas to be introduced or the positions of the induction heating coils are preferably adjusted such that the SiC single crystal wafer has the temperature gradient in which the temperature is the lowest in the wafer middle portion and the temperature increases toward the wafer outer circumferential portion.

A distance $d_1$ between the upper surface of the shielding plate 10 and the lower surface of the sealing 3 is preferably set within the range of 0.5 mm to 1 mm. This is because deposits of SiC are prevented from being deposited on the lower surface of the sealing 3 by the shielding plate 10.

The shielding plate 10 is disposed to be separate from an inner wall 1a of the chamber 1, and a separation distance $d_2$ between an outer circumferential side surface 10c of the shielding plate 10 and the inner wall 1a of the chamber 1 in the horizontal direction is preferably within the range of 1.0 mm to 3.0 mm. This is to prevent the shielding plate 10 from coming into contact with the wall surface 1a due to thermal expansion at the time of heating.

For example, when the shielding plate is formed of silicon carbide, the separation distance is preferably within the range of 1.0 mm to 2.0 mm.

A distance $d_3$ between an inner wall 10d of the opening 10b of the shielding plate 10 and the outer wall of the protrusion portion 12 is preferably set within the range of 0.5 mm to 1 mm. This is so that the shielding plate 10 is prevented from coming into contact with the protrusion portion 12 due to the thermal expansion at the time of heating and the gas is rarely flowed toward the space between the shielding plate 10 and the sealing 3 from the inner circumferential side of the shielding plate 10.

A distance d4 between the inner circumferential surface of the sealing 3 and the outer circumferential surface of the gas introduction pipe 5 is preferably set within the range of 0.5 mm or less. This is so that the gas introduction pipe 5 which is at a low temperature to introduce the raw material gas G is affected by the radiation heat from the sealing 3 which is heated at a high temperature by the foregoing induction coils 7 as little as possible.

In the embodiment, as illustrated in FIG. 7, the sealing 3 includes the protrusion portion 12 which is formed from the inner circumferential portion 3d of the lower surface 3c of the sealing 3 and between the inner wall 10d of the opening 10b of the shielding plate 10 and an outer wall 5b of the gas introduction pipe 5. The protrusion portion 12 may be formed integrally with the sealing 3 or may be a member separate from the sealing 3. The protrusion portion 12 is preferably disposed along the inner wall 10d in the opening 10b of the shielding plate 10. Only the cross-section of a part of the protrusion portion is illustrated in FIGS. 5 and 7.

The protrusion portion 12 can prevent the gas of the film material in a gaseous phase from penetrating from a gap between the inner wall 10d in the opening 10b of the shielding plate 10 and the outer wall 5b of the gas introduction pipe 5 to be deposited on the sealing 3.

In the embodiment, the protrusion portion 12 is provided, but may not be provided.

The epitaxial wafer manufacturing apparatus 100 according to the embodiment includes the shielding plate 10. Therefore, even when a material piece of the sealing 3 falls, the material piece can be received by the shielding plate 10, and thus can be prevented from falling on the wafer or the epitaxial layer. Accordingly, it is possible to reduce a surface density a triangular defects having the material piece of the sealing 3 as a starting point in the epitaxial layer. Also, since the lower surface of the shielding plate 10 is covered with the silicon carbide film or the pyrolytic carbon film or the shielding plate 10 is formed of silicon carbide, an amount of material pieces falling from the shielding plate 10 is less compared to the sealing.

Accordingly, when the epitaxial wafer manufacturing apparatus is used, it is possible to manufacture the SiC epitaxial wafer with a lower surface density of triangular defects having a material piece of an internal member of the chamber as a starting point compared to a case in which an epitaxial wafer manufacturing apparatus of the related art is used.

SiC Epitaxial Wafer Manufacturing Apparatus (Second Embodiment)

An epitaxial wafer manufacturing apparatus according to an embodiment herein includes a susceptor that includes a wafer placement unit on which a wafer is placed and a sealing (top plate) that is disposed to face the upper surface of the susceptor so that a reaction space is formed between the sealing and the susceptor. The sealing is formed of silicon carbide or the surface of the sealing facing the susceptor is covered with a silicon carbide film or a pyrolytic carbon film, and an epitaxial layer is formed on a surface of the wafer while a raw material gas is supplied into a chamber. The epitaxial wafer manufacturing apparatus is different from the epitaxial wafer manufacturing apparatus according to the first embodiment in that a shielding plate is not provided.

In the epitaxial wafer manufacturing apparatus, since material pieces falling on the wafer from the sealing are reduced, it is possible to manufacture a SiC epitaxial wafer with a low surface density of triangular defects having a material piece of an internal member of the chamber as a starting point.

In the epitaxial wafer manufacturing apparatus of the present invention, since the surface of a member (a shielding plate when a shielding plate is provided, and a sealing when no shielding plate is provided) facing the susceptor is formed of a silicon carbide film or a pyrolytic carbon film, a triangular defect having a material piece of an internal member of the chamber as a starting point can be reduced. However, other internal members of the chamber are preferably formed of the material.

SiC Epitaxial Wafer Manufacturing Method (First Embodiment)

An epitaxial wafer manufacturing method according to an embodiment herein includes a process of manufacturing a SiC epitaxial wafer using the epitaxial wafer manufacturing apparatus according to the first embodiment and a process of manufacturing a subsequent SiC epitaxial wafer after measuring a surface density of triangular defects having a material piece of an internal member of a chamber as a starting point in a SiC epitaxial layer of the previously manufactured SiC epitaxial wafer.

Since the method includes the process of manufacturing the surface density of the triangular defects, it is possible to manage the surface density of the triangular defects having the material piece of the internal member of the chamber as the starting point on the SiC epitaxial layer.

<Polishing Process>

In the polishing process, the 4H—SiC single crystal substrate remaining on the surface of the wafer in a slice process is polished until the thickness of a lattice disturbance layer on the surface of the wafer is 3 nm or less.

The "lattice disturbance layer" refers to a layer in which a part of a striped structure or a stripe thereof corresponding to an atomic layer (lattice) of the SiC single crystal substrate is not clear in a lattice image (an image in which a crystal lattice can be confirmed) of a TEM (see Patent Literature 5).

The polishing process normally includes a plurality of polishing processes such as rough polishing called lap, precise polishing called polish, and chemical mechanical polishing (hereinafter referred to as CMP) which is more precise polishing. By setting a processing pressure in mechanical polishing before the CMP to 350 g/cm$^2$ or less and performing the polishing using sharpening particles with a diameter of 5 μm or less, the thickness of a damage layer (not only a damage detectable as the "lattice disturbance layer" by the TEM but also a portion in which distortion or the like of the lattice undetectable by the TEM exists more deeply) is preferably suppressed to 50 nm. Further, a polishing slurry containing polishing material particles with an average particle diameter of 10 nm to 150 nm and inorganic acid is used in the CMP. Here, pH of the polishing slurry at 20° C. is preferably 2 or less. The polishing material particles are silica and 1 mass % to 30 mass % thereof is preferably contained. The inorganic acid is more preferably at least one kind of acid among hydrochloric acid, nitric acid, phosphoric acid, and sulfuric acid.

<Cleaning (Gas Etching) Process>

In the cleaning process, the substrate after the polishing and convex processing is heated at 1400° C. to 1800° C. under a hydrogen atmosphere so that the surface is subjected to cleaning (gas etching).

The gas etching is performed for 5 minutes to 30 minutes at a flow rate of a hydrogen gas of 40 slm to 120 slm and at a pressure of 100 mbar to 250 mbar by maintaining the SiC single crystal substrate at 1400° C. to 1800° C.

After the polished SiC single crystal substrate is cleaned, the substrate is set in an epitaxial growth apparatus, for example, a plurality of planetary type CVD apparatuses for mass production. After the hydrogen gas is introduced into the apparatus, the pressure is adjusted to 100 mbar to 250 mbar. Thereafter, the temperature of the apparatus is raised so that the substrate temperature is within the range of 1400° C. to 1600° C. and is preferably set to be equal to or greater than 1480° C. and equal to or less than 1600° C., and the gas etching is performed on the surface of the substrate using the hydrogen gas for 1 minute to 30 minutes. When the gas etching is performed using the hydrogen gas under the same conditions, an etching amount is about 0.05 μm to 0.4 μm.

SiH$_4$ gas and/or C$_3$H$_8$ gas can be added to the hydrogen gas. In a shallow pit caused in spiral dislocation, short step bunching incidentally occurs in some cases. By adding SiH$_4$ gas with concentration less than 0.009 mol % to the hydrogen gas and performing the gas etching, Si becomes rich in the environment of a reactor and the depth of the shallow pit can be made shallow, thereby suppressing occurrence of the short step bunching incidental on the shallow pit.

When the SiH$_4$ gas and/or the C$_3$H$_8$ gas is added to the hydrogen gas, a hydrogen gas atmosphere is preferably formed by performing discharging at once before a film forming (epitaxial growth) process.

<Film Forming (Epitaxial Growth) Process>

In the film forming (epitaxial growth) process, the SiC film is allowed to epitaxially grow by supplying the surface of the substrate after the foregoing cleaning with an amount of carbon-containing gas and an amount of silicon-containing gas necessary for the epitaxial growth of silicon carbide at a predetermined concentration ratio.

When the temperature of the growth of the epitaxial layer is higher than the temperature of the cleaning (gas etching), the film forming process is performed after an increase in the temperature from the cleaning process. Also, an example of a combination of the carbon-containing gas and the silicon-containing gas at the predetermined concentration ratio includes a combination of the $C_3H_8$ gas and the $SiH_4$ gas at a concentration ratio C/Si of 0.7 to 1.2.

The carbon-containing gas and the silicon-containing gas are preferably supplied simultaneously. This is so that the step bunching is considerably reduced.

Here, the "simultaneous supply" means that the gases may not necessarily be supplied at exactly the same time but a difference between timings of the supply of the gases is within several seconds.

The respective flow rates, the pressures, the substrate temperatures, and the growth temperatures of the $SiH_4$ gas and the $C_3H_8$ gas are 15 sccm to 150 sccm, 3.5 sccm to 60 sccm, 80 mbar to 250 mbar, and greater than 1600° C. and equal to or less than 1800° C. The growth speed of the SiC film is within the range of 1 μm to 20 μm per hour. The uniformity of the off-angle, the film thickness, and the carrier concentration is determined while the growth speed is controlled. By introducing nitrogen gas as a doping gas simultaneously with the start of the forming of the film, the carrier concentration in the epitaxial layer can be controlled. A method of lowering the concentration ratio C/Si of the supplied raw material gases and increasing migration of Si atoms on the growing surface is known as a method of suppressing the step bunching during the growth. In the present invention, however, the concentration ratio C/Si is within the range of 0.7 to 1.2. Normally, the growing epitaxial layer has a film thickness of about 5 μm to about 20 μm and the carrier concentration is the range of about 2 to $15 \times 10^{15}$ $cm^{-3}$.

The growth temperature is within the range of 1400° C. to 1800° C., but the lower limit of the growth temperature is preferably 1600° C. in order to reduce a stacking fault. Also, the growth speed is preferably faster as the growth temperature is higher. When the growth temperature is the same, the growth speed is preferably faster as the off-angle of the SiC single crystal substrate is larger.

For example, (1) when a 4H—SiC single crystal substrate with an off-angle of 0.4° to 2° is used, the growth temperature and the grow speed are preferably adjusted as follows.

When the growth temperature at which the silicon carbide film is allowed to epitaxially grow is set within the range of 1600° C. to 1640° C., the growth speed is set within the range of 1 μm/h to 3 μm/h.

When the growth temperature is set within the range of 1640° C. to 1700° C., the growth speed is set within the range of 3 μm/h to 4 μm/h.

When the growth temperature is set within the range of 1700° C. to 1800° C., the growth speed is set within the range of 4 μm/h to 10 μm/h.

(2) When a 4H—SiC single crystal substrate with an off-angle of 2° to 5° is used, the growth temperature and the growth speed are preferably adjusted as follows.

When the growth temperature at which the silicon carbide film is allowed to epitaxially grow is set within the range of 1600° C. to 1640° C., the growth speed is set within the range of 2 μm/h to 4 μm/h.

When the growth temperature is set within the range of 1640° C. to 1700° C., the growth speed is set within the range of 4 μm/h to 10 μm/h.

When the growth temperature is set within the range of 1700° C. to 1800° C., the growth speed is set within the range of 10 μm/h to 20 μm/h.

<Temperature Dropping Process>

In a temperature dropping process, the supply of the carbon-containing gas and the silicon-containing gas (for example, a $SiH_4$ gas and a $C_3H_8$ gas) is preferably stopped simultaneously. This is so that degradation in morphology is efficiently suppressed. After the stop, the substrate temperature is maintained until the carbon-containing gas and the silicon-containing gas are discharged. Thereafter, the temperature is dropped.

<Processes of Measuring Surface Density of Triangular Defect and Replacing Member>

Regularly (for each production lot, every plurality of production lots, or the like) or irregularly, the surface density of the triangular defects having the material piece of the internal member of the chamber as the starting point on the SiC epitaxial layer of the SiC epitaxial wafer is measured. After the measurement, a subsequent SiC epitaxial wafer is manufactured.

The surface density of the triangular defects having the material piece of the internal member of the chamber as the starting point can be obtained, for example, by shifting the position of focus from the surface of the epitaxial layer of the SiC epitaxial wafer to an interface side (film depth direction) between the epitaxial layer and the SiC single crystal substrate, finding the triangular defect having the material piece of the internal member of the chamber as the starting point, and measuring the triangular defect using an optical microscope. In the embodiment, kinds (types) of triangular defects increasing due to the repetition of the forming of the film can be considered to be only the triangular defect having the material piece of the internal member of the chamber as the starting point and the triangular defect having the downfall as the starting point. Normally, the starting point of the triangular defect having the downfall as the starting point is clear, but the starting point of the triangular defect having the material piece of the internal member of the chamber as the starting point is unclear. By identifying the triangular defect having the downfall as the starting point and managing an increase in its surface density based on the characteristics, it is possible to manufacture the SiC epitaxial wafer with a low surface density of the triangular defects having the material piece of the internal member of the chamber as the starting point. When the density of the triangular defects having the material piece of the internal member of the chamber as the starting point is desired to be measured and managed more precisely, the composition of a foreign material present in the front of the triangular defect is analyzed using energy dispersive X-ray spectroscopy or the like.

When the surface density of the triangular defects having the material piece of the internal member of the chamber as the starting point is greater than a predetermined density as the result of the foregoing measurement, it is desirable to replace the shielding plate 10 and manufacture a subsequent SiC epitaxial wafer. For example, when the surface density of the triangular defects in the previously manufactured SiC epitaxial wafer is about 0.25 pieces/$cm^2$, the SiC epitaxial wafer of which the surface density of the triangular defects is reliably equal to or less than 0.5 pieces/$cm^2$ can be manufactured by replacing the shielding plate 10 and manufacturing the subsequent SiC epitaxial wafer.

SiC Epitaxial Wafer Manufacturing Method
(Second Embodiment)

An epitaxial wafer manufacturing method according to an embodiment herein includes a process of manufacturing a SiC epitaxial wafer using the epitaxial wafer manufacturing apparatus according to the second embodiment and a process of manufacturing a subsequent SiC epitaxial wafer after measuring a surface density of triangular defects having a material piece of a internal member of a chamber as a starting point in a SiC epitaxial layer of the previously manufactured SiC epitaxial wafer.

Since the method includes the process of measuring the surface density of the triangular defects, it is possible to manage the surface density of the triangular defects having the material piece of the internal member of the chamber as the starting point on the SiC epitaxial layer.

In the epitaxial wafer manufacturing method according to the embodiment, it is also possible to manufacture each SiC epitaxial wafer, as in the first embodiment.

Also, the process of measuring the surface density of the triangular defects can also be performed as in the first embodiment.

When the surface density of the triangular defects having the material piece of the internal member of the chamber as the starting point is greater than a predetermined density as the result of the foregoing measurement, it is desirable to replace the sealing 3 and manufacture a subsequent SiC epitaxial wafer. For example, when the surface density of the triangular defects in the previously manufactured SiC epitaxial wafer is about 0.25 pieces/cm$^2$, the SiC epitaxial wafer of which the surface density of the triangular defects is reliably equal to or less than 0.5 pieces/cm$^2$ can be manufactured by replacing the sealing 3 and manufacturing the subsequent SiC epitaxial wafer.

EXAMPLES

Hereinafter, the advantageous effects of the present invention will be described specifically according to examples. The present invention is not limited to these examples.

Example

In an example herein, the SiC epitaxial wafer manufacturing apparatus and the SiC epitaxial wafer manufacturing method according to the first embodiment were realized.

In the SiC epitaxial wafer manufacturing apparatus illustrated in FIG. 5, the sealing formed of graphite and the shielding plate (with a diameter of 371 mm and a thickness of 4 mm) which was divided into two portions illustrated in FIG. 6 and in which a graphite substrate was covered with a silicon carbide film were used. The shielding plate was disposed to be a distance ($d_1$) of 0.5 mm from the sealing.

A SiC single crystal wafer which had a Si surface in which the c surface ((0001) surface) was inclined at 4° in the <11-20> direction as a main surface, a diameter of 3 inches (76.2 mm), and a thickness of 350 μm was used as the 4H—SiC single crystal wafer.

Next, as preprocessing, organic solvent cleaning, acid and alkali cleaning, and sufficient water washing were performed on the SiC single crystal wafer.

The SiC single crystal wafer was placed on the wafer placement unit, vacuum discharging was performed, and then hydrogen gas was introduced so that an atmosphere was adjusted to a reduced-pressure atmosphere of 200 mbar.

Thereafter, a temperature was raised up to 1570° C., growth was performed at a growth speed of 5 μm/h for 1 hour, and a SiC epitaxial layer with a thickness of 5 μm was formed to manufacture the SiC epitaxial wafer.

Hydrogen was used as the carrier gas, a mixed gas of SiH$_4$ and C$_3$H$_8$ was used as the raw material gas, and N$_2$ was supplied as a dopant.

Figure 8A:
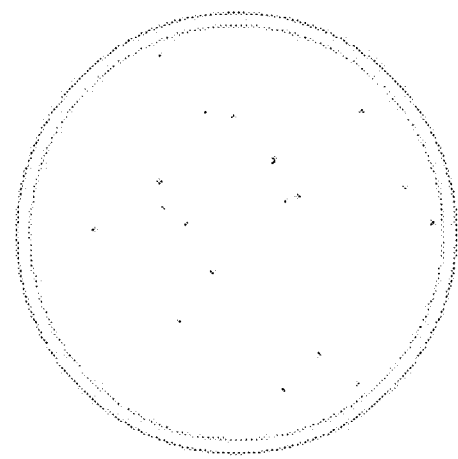
FIG. 8A is a diagram illustrating a candela image of an example.
Figure 8B:
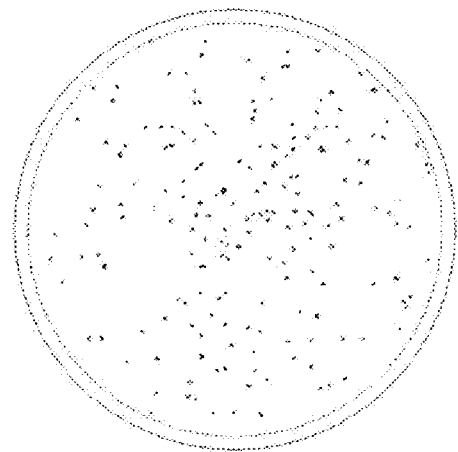
FIG. 8B is a diagram illustrating a candela image of an example.

The SiC epitaxial wafer was repeatedly manufactured under the above conditions without replacing the internal member of the chamber. FIGS. 8A and 8B are diagrams illustrating a candela image of the 2$^{nd}$ production lot and a candela image of the 80$^{th}$ production lot. Dots shown with a black spot shape indicate the triangular defects.

The number of all of the kinds of triangular defects was measured from the candela images and the surface densities of all of the kinds of triangular defects were obtained. By a method of performing observation by shifting the focus using an optical microscope, the number of triangular defects having the material piece of the internal member of the chamber as the starting point was measured and the surface density of the triangular defects was obtained.

The surface density of the triangular defects of the SiC epitaxial wafer of the 2$^{nd}$ production lot was 0.5 pieces/cm$^2$ and the surface density of the triangular defects having the material piece of the internal member of the chamber as the starting point was 0 pieces/cm$^2$ in this surface density.

The surface density of the triangular defects of the SiC epitaxial wafer of the 80th production lot was 2 pieces/cm$^2$ and the surface density of the triangular defects having the material piece of the internal member of the chamber as the starting point was 0.5 pieces/cm$^2$ in this surface density.

The surface density of the triangular defects of the SiC epitaxial wafer of the 20$^{th}$ production lot was 1 piece/cm$^2$ and the surface density of the triangular defects having the material piece of the internal member of the chamber as the starting point was 0 pieces/cm$^2$ in this surface density.

Figure 8C:
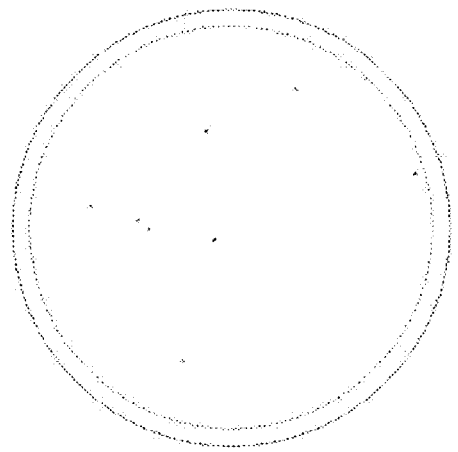
FIG. 8C is a diagram illustrating a candela image of an example.

FIG. 8C is a diagram illustrating a candela image of the production lot manufactured immediately after the placement of the shielding plate with a new shielding plate after the 80$^{th}$ SiC epitaxial wafer is manufactured. The surface density of the triangular defects was 0.5 pieces/cm$^2$ and the surface density of the triangular defects having the material piece of the internal member of the chamber as the starting point was 0 pieces/cm$^2$ in this surface density.

From this result, it can be confirmed that the surface density of the triangular defects having the material piece of the internal member of the chamber as the starting point can be reduced by replacing the shielding plate with a new shielding plate.

Comparative Example 1

A first comparative example was different from the example in that a shielding plate in which the graphite substrate was covered with a tantalum carbide film was used in the SiC epitaxial wafer manufacturing apparatus used in the example and the other manufacturing conditions were the same.

Figure 9A:
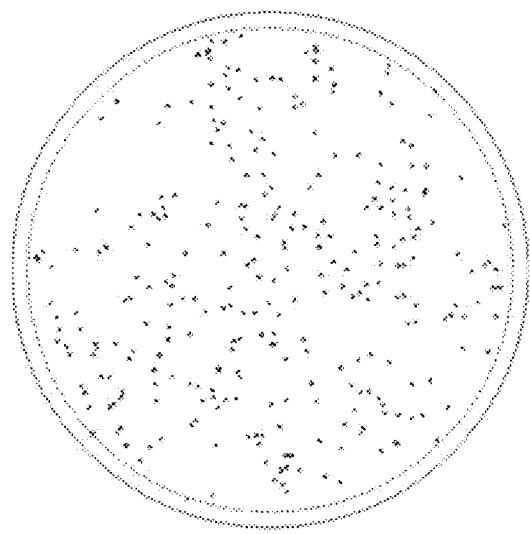
FIG. 9A is a diagram illustrating a candela image of a first comparative example.

The SiC epitaxial wafer was repeatedly manufactured under the condition without replacing the internal member of the chamber. FIG. 9A is a diagram illustrating a candela image of the 20$^{th}$ production lot.

The surface density of all of the kinds of triangular defects of the SiC epitaxial wafer was 2 pieces/cm$^2$ and the surface density of the triangular defects having the material piece of the internal member of the chamber as the starting point was 1 piece/cm$^2$ in this surface density.

Although the number of repetitions of the manufacturing the SiC epitaxial wafer is the same as that of the case of the example, both of the surface density of all of the kinds of triangular defects and the surface density of the triangular defects having the material piece of the internal member of the chamber as the starting point were higher than those of the example.

From this result, it can be understood that the surface density of all of the kinds of triangular defects and the surface density of the triangular defects having the material piece of the internal member of the chamber as the starting point can be reduced using the plate in which the graphite substrate is covered with the silicon carbide film as the shielding plate compared to when the plate in which the graphite substrate is covered with the tantalum carbide film is used.

Comparative Example 2

A second comparative example was different from the example in that a shielding plate in which the shielding plate was not used in the SiC epitaxial wafer manufacturing apparatus used in the example and the other manufacturing conditions were the same.

Figure 9B:
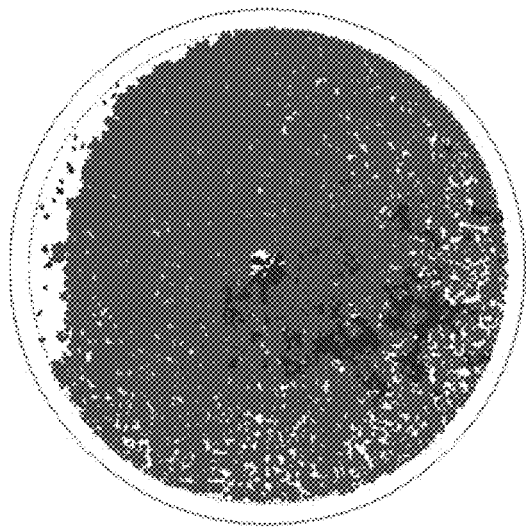
FIG. 9B is a diagram illustrating a candela image of a second comparative example.

The SiC epitaxial wafer was repeatedly manufactured under the condition without replacing the internal member of the chamber. FIG. 9B is a diagram illustrating a candela image of the 20$^{th}$ production lot.

The surface density of all of the kinds of triangular defects of the SiC epitaxial wafer was 100 pieces/cm$^2$ and the surface density of the triangular defects having the material piece of the internal member of the chamber as the starting point was 90 pieces/cm$^2$ in this surface density.

Although the number of repetitions of the manufacturing the SiC epitaxial wafer is the same as that of the case of the example, both of the surface density of all of the kinds of triangular defects and the surface density of the triangular defects having the material piece of the internal member of the chamber as the starting point were considerably higher than those of the example.

From this result, it can be understood that the surface density of all of the kinds of triangular defects and the surface density of the triangular defects having the material piece of the internal member of the chamber as the starting point can be considerably reduced using the shielding plate.

INDUSTRIAL APPLICABILITY

A SiC epitaxial wafer, a SiC epitaxial wafer manufacturing method, and a SiC epitaxial wafer manufacturing apparatus according to the present invention can be used to manufacture a SiC epitaxial wafer with a low surface density of triangular defects having a material piece of a internal member of a chamber as a starting point.

REFERENCE SIGNS LIST

1 Chamber
1a Inner wall
2 Susceptor
2b Placement unit
3 Sealing (top plate)
4 Reaction space
6, 7 Induction coil (a heating device)
10 Shielding plate
10a Outer circumferential portion
10A, 10B Shielding plate
11 Holding unit
100 CVD apparatus (epitaxial wafer manufacturing apparatus)

What is claimed is:

1. A measurement method of a triangular defect, which is present in a SiC epitaxial layer formed on a SiC single crystal substrate in a SiC epitaxial wafer, by using an optical microscope or an optical surface inspection apparatus using a laser beam, comprising
   shifting a position of focus in an optical image from a surface of the SiC epitaxial layer toward an interface between the SiC epitaxial layer and the SiC single crystal substrate, to thereby identify a starting point of the triangular defect, wherein
   the triangular defect has a material piece of an internal member of a chamber as the starting point and
   the triangular defect is a triangle-shaped defect which has the material piece of the internal member of the chamber as an apex and is formed along a step-flow growth direction in which the apex of a triangle and its opposite side (base) are sequentially arranged.

2. The measurement method according to claim 1, further comprising: analyzing a composition of the triangular defect by using an energy dispersive X-ray spectroscopy.

3. A SiC epitaxial wafer manufacturing method comprising:
   manufacturing a SiC epitaxial wafer including a SiC epitaxial layer on a surface of a SiC single crystal wafer while supplying a raw material gas into a chamber by using a SiC epitaxial wafer manufacturing apparatus;
   manufacturing a subsequent SiC epitaxial wafer after a measurement of a surface density of a triangular defect, which has a material piece of an internal member of the chamber as a starting point, in the SiC epitaxial layer of the previously manufactured SiC epitaxial wafer; and
   replacing the internal member of the chamber according to a result of the measurement of the surface density of the triangular defect, wherein
   the measurement of the surface density of the triangular defect comprises shifting a position of focus in an optical image of an optical microscope or an optical surface inspection apparatus using a laser beam from a surface of the SiC epitaxial layer toward an interface between the SiC epitaxial layer and the SiC single crystal substrate, to thereby identify the starting point of the triangular defect.

4. The SiC epitaxial wafer manufacturing method according to claim 3, wherein
   the SiC epitaxial wafer manufacturing apparatus includes: a susceptor that includes a wafer placement unit on which a wafer is placed; a top plate that is disposed to face an upper surface of the susceptor so that a reaction space is formed between the susceptor and the top plate; and a shielding plate that is disposed to be close to a lower surface of the top plate to such an extent that a deposit is prevented from being attached to the lower surface of the top plate, and
   the internal member of the chamber to be replaced is the shielding plate.

5. The SiC epitaxial wafer manufacturing method according to claim 3, wherein
   the SiC epitaxial wafer manufacturing apparatus includes: a susceptor that includes a wafer placement unit on which a wafer is placed; and a top plate that is disposed to face an upper surface of the susceptor so that a reaction space is formed between the susceptor and the top plate, and
   the internal member of the chamber to be replaced is the top plate.

* * * * *